US010390449B2

(12) United States Patent
Jiang

(10) Patent No.: US 10,390,449 B2
(45) Date of Patent: Aug. 20, 2019

(54) ELECTRICAL DEVICE FOR RAIL MOUNTING

(71) Applicant: FRIWO Gerätebau GmbH, Ostbevern (DE)

(72) Inventor: Weihua Jiang, Shenzhen Guangdong (CN)

(73) Assignee: FRIWO Gerätebau GmbH, Ostbevern (DE)

( * ) Notice: Subject to any disclaimer, the term of this patent is extended or adjusted under 35 U.S.C. 154(b) by 0 days.

(21) Appl. No.: 15/434,955

(22) Filed: Feb. 16, 2017

(65) Prior Publication Data

US 2017/0238433 A1 Aug. 17, 2017

(30) Foreign Application Priority Data

Feb. 16, 2016 (EP) ..................................... 16155836

(51) Int. Cl.
*H02B 1/052* (2006.01)
*H05K 5/02* (2006.01)

(52) U.S. Cl.
CPC ......... *H05K 5/0221* (2013.01); *H02B 1/0523* (2013.01)

(58) Field of Classification Search
CPC .... H05K 5/0221; H05K 5/0226; H05K 5/023; H02B 1/044; H02B 1/048; H02B 1/052; H02B 1/0523; H02B 1/0526
See application file for complete search history.

(56) References Cited

U.S. PATENT DOCUMENTS

| 5,761,026 A | * | 6/1998 | Robinson | ............... H02B 1/056 200/303 |
| 5,904,592 A | * | 5/1999 | Baran | .................... H02B 1/052 361/627 |
| 6,292,076 B1 | * | 9/2001 | DeGrazia | ............... H02B 1/052 335/202 |

(Continued)

FOREIGN PATENT DOCUMENTS

| DE | 1162443 | 2/1964 |
| DE | 1174873 | 7/1964 |

(Continued)

OTHER PUBLICATIONS

European Patent Office Action for Application No. 16155836 dated Jun. 24, 2016 (7 pages).

*Primary Examiner* — Hoa C Nguyen
(74) *Attorney, Agent, or Firm* — Michael Best & Friedrich LLP

(57) ABSTRACT

The present invention relates to an electrical device for rail mounting. Such electrical devices are mounted in use in a side-by-side relationship on a carrier rail. An electrical device for rail mounting comprises a housing having a rail receiving recess therein, at least one edge of said recess being defined by an end region of a latch member that is movable relative to the housing in a direction transverse to the recess, and resilient means biasing the latch member to move in a direction to reduce the width of said recess. Said resilient means comprise a torsion spring having a first leg and a second leg deflectable around a hinge region, said first leg resting against a protrusion of the housing, and said second leg resting against the latch member.

14 Claims, 8 Drawing Sheets

(56) References Cited

U.S. PATENT DOCUMENTS

| | | | | |
|---|---|---|---|---|
| 6,293,820 B1* | 9/2001 | Bechaz | ............... | H02B 1/052 |
| | | | | 439/532 |
| 8,226,433 B1* | 7/2012 | Correll | ............... | H01R 9/2608 |
| | | | | 439/532 |
| 2009/0286422 A1* | 11/2009 | Henkel | ............... | H02B 1/052 |
| | | | | 439/532 |
| 2011/0248816 A1* | 10/2011 | Duval | ............... | H01C 7/126 |
| | | | | 338/20 |
| 2016/0021776 A1* | 1/2016 | Ho | ............... | H02B 1/523 |
| | | | | 248/231.31 |
| 2016/0081215 A1* | 3/2016 | Boretti | ............... | H05K 7/1401 |
| | | | | 248/221.11 |

FOREIGN PATENT DOCUMENTS

| | | |
|---|---|---|
| EP | 0184143 | 6/1986 |
| EP | 2677846 | 12/2013 |
| FR | 2432258 | 2/1980 |

\* cited by examiner

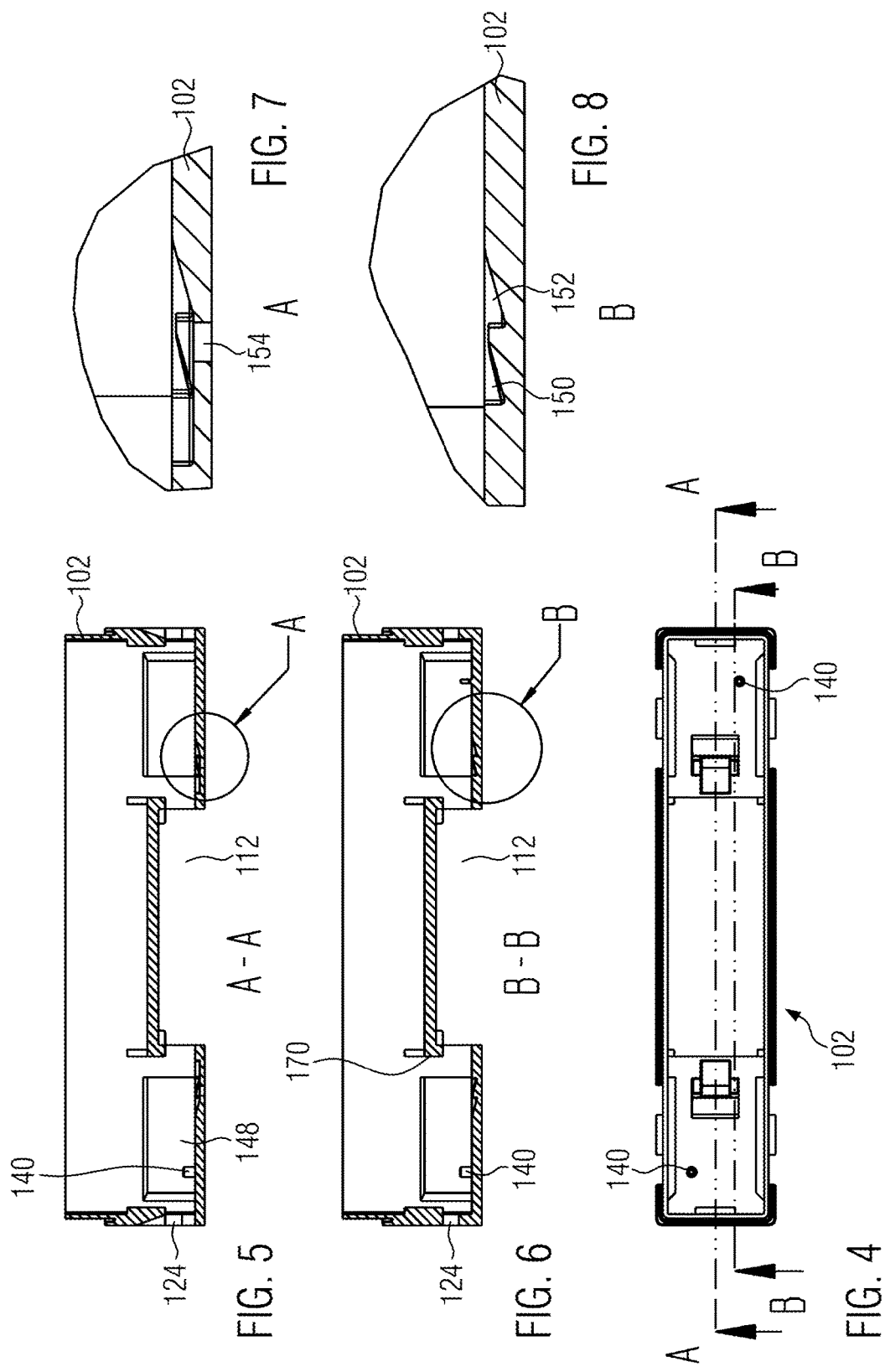

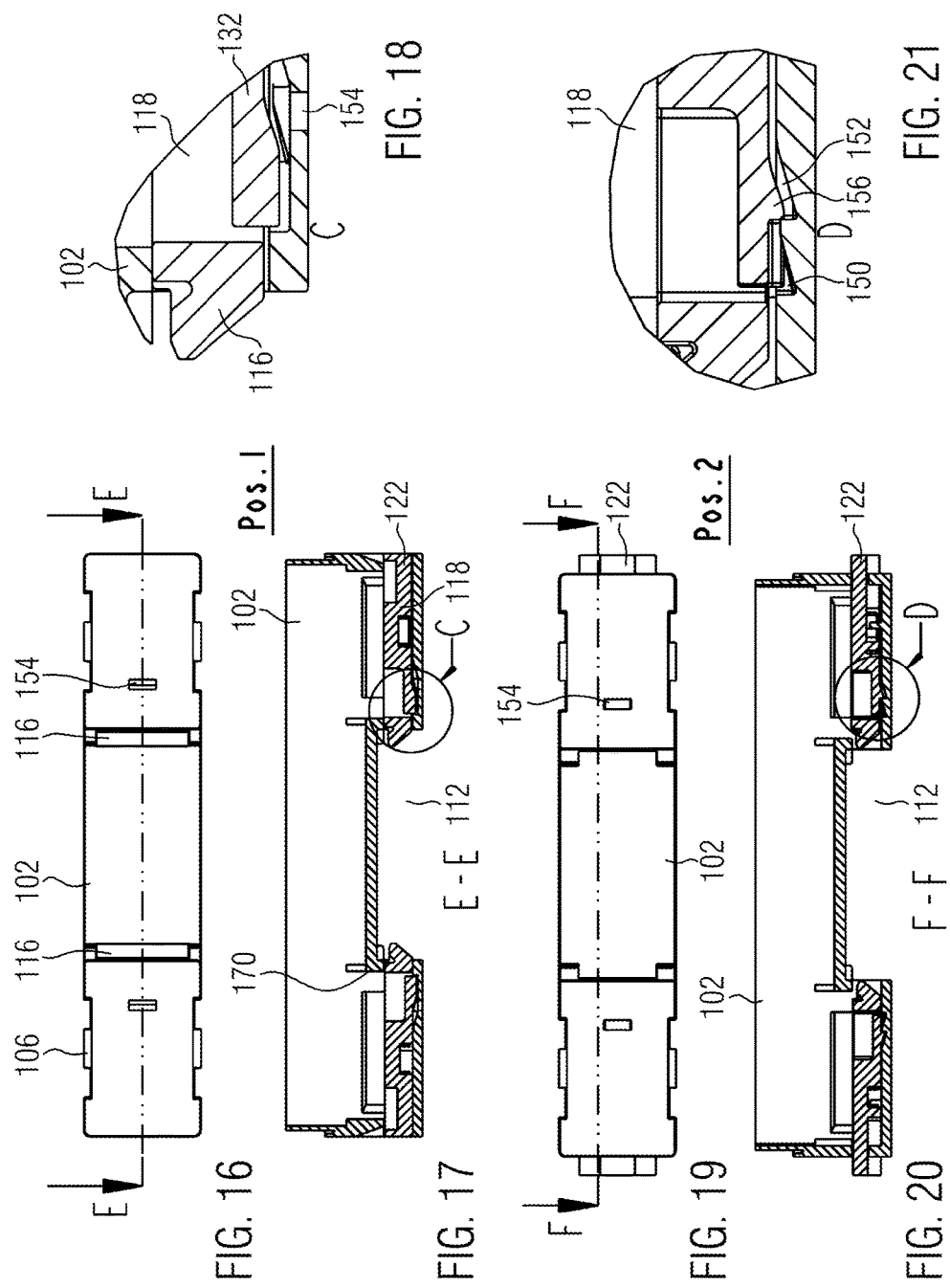

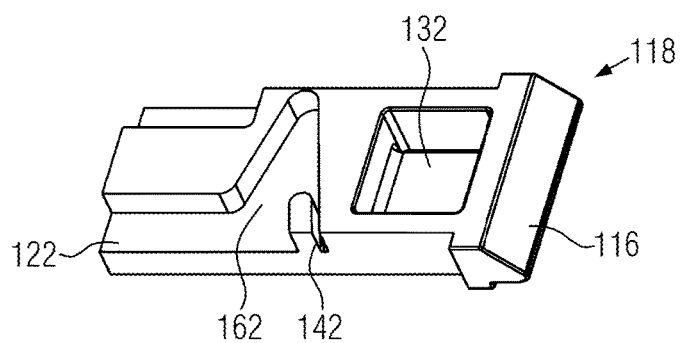
FIG. 28
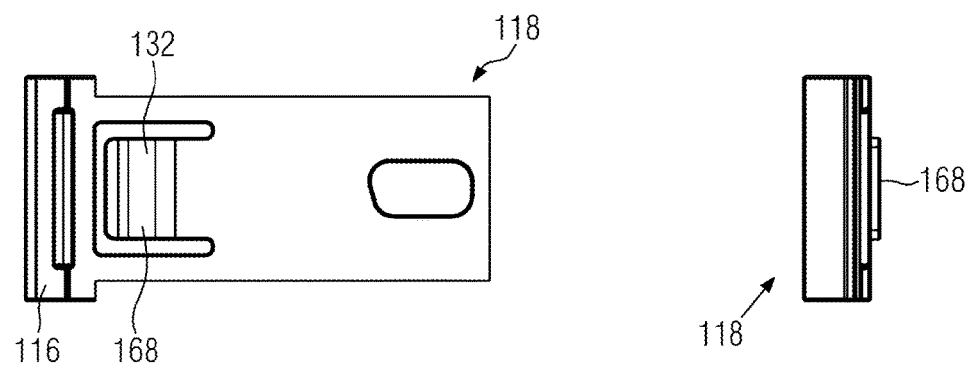
FIG. 29
FIG. 31
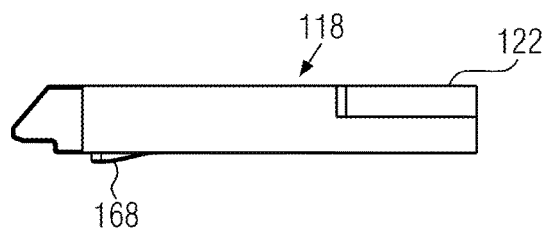
FIG. 30

ELECTRICAL DEVICE FOR RAIL MOUNTING

BACKGROUND OF THE INVENTION

The present invention relates to an electrical device for rail mounting. Such electrical devices are mounted in use in a side-by-side relationship on a carrier rail, the so-called DIN rail (also known as top hat rail according to the European standard EN 50022, in the USA called TS35 rail). The present invention can be used with devices such as circuit breakers, fuse units, safety switching and control devices, and rail mounted power supplies, to name only a few.

Conventional rail mounted electrical devices comprise an electrically insulating housing that is shaped at one side to engage a carrier rail. At this side, the housing has a dovetail shaped transversely extending recess within which the rail is gripped in use. One side of this recess is defined by a latch member movable relatively to the housing to permit a snap-on engagement and disengagement of the housing and the rail, and the latch member is resiliently biased relative to the housing in a direction to reduce the width of the recess and thus to grip the rail in use.

Where one of the known devices is utilized alone then it is necessary to hold the latch member in a retracted position against the action of its resilient bias, while manipulating the device to disengage it from the rail. Such a mode of operation is inconvenient, but it will be realized that where a device comprises two or more units physically secured together, for handling as a unitary structure, as would be the case with two or more ganged isolators, then it is extremely difficult to hold two or more latches in their retracted position while manipulating the unitary structure relative to the rail.

In an attempt to overcome this problem it has previously been proposed to incorporate into each device a catch element movable manually, transversely relative to the latch member and cooperating with the housing to permit locking of the latch member in a retracted position. The provision of such a catch member simplifies operation by permitting latch members to be locked in their retracted positions but of course increases the complexity, and therefore cost of each unit.

Consequently, GB 2216177 A1 proposes an electrical device for rail mounting comprising a housing having a rail receiving recess therein, one edge of said recess being defined by an end region of a latch member movable relative to the housing in a direction transverse to the recess, resilient means biasing the latch member to move relative to the housing in a direction to reduce the width of said recess, and, interengagable surfaces on the housing and the latch member respectively which cooperate, when the latch member is retracted to a predetermined position against the action of said resilient means, to retain the latch member in said retracted position, said surfaces being such that the latch member can be released for movement under the action of said resilient means by a movement of the latch member relative to the housing in a direction transverse to the direction of movement of the latch member under the action of said resilient means.

This known solution, however, has the disadvantage that a compression spring is needed for biasing the latch member, which is space consuming and complicates the assembly process.

Consequently, there is still a need for an electrical device that can be mounted on a DIN rail efficiently, securely, and precisely, while the electrical device can be fabricated in a particularly cost-efficient way.

SUMMARY OF THE INVENTION

The present invention provides an electrical device for rail mounting which comprises a housing having a rail receiving recess therein, at least one edge of said recess being defined by an end region of a latch member that is movable relative to the housing in a direction transverse to the recess. Resilient means are provided for biasing the latch member to move in a direction to reduce the width of said recess.

The present invention is based on the idea that the resilient means comprise a torsion spring having a first leg and a second leg deflectable around a hinge region, said first leg resting against a protrusion of the housing, and said second leg resting against the latch member. This particular design has the advantage that the spring is particularly space saving and yet provides a sufficiently high biasing force. In addition, the assembly of the housing of the electrical device is significantly facilitated.

Torsion springs are springs that are designed with ends that can be rotated in angular deflection around a hinge region. This offers resistance to externally applied torque. Torsion springs are for instance close wound coils with the legs arranged at each end. Alternatively, the torsion spring may also be formed from a bent metal sheet. There are a variety of options for end configurations of torsion springs to allow the spring to be anchored in several different configurations. Moreover, the legs may be located at varying positions, angles, or distances from the hinge region of the spring.

According to an advantageous embodiment, the second leg of the torsion spring is at least partly received in a groove provided at the latch member. Thereby safe support of this part of the torsion spring can be achieved and, moreover, the spring can be mounted at the latch member before assembling same within the housing without any danger that the spring gets lost.

As already mentioned, various angles can be provided between the two legs. According to an advantageous embodiment, an angle between the legs is in a range between 20° and 40° in an unloaded state of the torsion spring. For instance, the angle may be 30°. This value allows a sufficiently long linear movement of the latch member within the housing.

In order to safely store the spring in a space saving manner, said torsion spring is arranged in a recess of the latch member that follows the outer contour of the torsion spring in the unloaded state.

According to an advantageous embodiment of the present invention, said torsion spring is a flat spring. Like sheet metal stampings, flat springs are parts that are stamped, laser cut, or photo-chemically etched from a sheet of material. In most cases, the blanks are then formed, heat treated as necessary and finished to have their final shape. In particular, the flat torsion spring has a V-shaped form.

In order to allow an efficient interaction between the housing, the latch member, and the torsion spring, said first leg has a shorter length than said second leg extending from said hinge region.

According to the present invention, the latch member further comprises a detent lug that engages with a first detent recess at the housing for securing the latch member in a closed position. Thereby the latch member can be prevented from being released inadvertently. In order to remove the electric device from the DIN rail, the latch member has to be releasable. This can be achieved by providing an opening through which the detent lug is accessible from the outside of the housing for disengaging the detent lug from the housing. In particular, the housing may comprise an opening for inserting a tool for disengaging the detent lug from the housing. Without using the special tool the latch member cannot be unlocked, so that a particularly secure mounting of the electrical device on the DIN rail can be achieved.

According to an advantageous embodiment of the present invention, said housing further comprises a second detent recess for securing the latch member in an open position. Such a second locking mechanism allows a facilitated mounting of the electrical device on the DIN rail. In particular, it is not necessary to manually hold open the latch member against the restoring force of the torsion spring.

Furthermore, said housing comprises a bottom shell and a cover, wherein said latch member is arranged at said bottom shell. By using such a modular design, an improved flexibility regarding the adaptation to various constructional needs can be achieved.

According to one embodiment of the present invention, the housing comprises an integrally formed fixed rail gripping hook which is arranged opposite to said latch member for gripping the rail. This design allows for a particular simple and cost effective assembly because only one latch member is needed. Alternatively, in order to allow for an enhanced flexibility regarding the mounting position, the housing may of course also comprise two opposing latch members for gripping the rail. Advantageously, the latch members are formed identically.

A particularly effective actuating of the latch member can be achieved when the housing comprises a retention pin that compresses the torsion spring in an open position of the latch member.

BRIEF DESCRIPTION OF THE DRAWINGS

The accompanying drawings are incorporated into the specification and form a part of the specification to illustrate several embodiments of the present invention. These drawings, together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements, and wherein:

FIG. 4 is a top view of the bottom shell according to the first embodiment;

FIG. 5 is a sectional view along the line A-A of FIG. 4;

FIG. 6 is a sectional view along the line B-B of FIG. 4;

FIG. 7 is a detail of FIG. 5;

FIG. 8 is a detail of FIG. 6;

FIG. 16 is a bottom view of an electrical device for rail mounting having two opposing latch members in a closed position;

FIG. 17 is a sectional view along the line E-E of FIG. 16;

FIG. 18 is a detail of FIG. 17;

FIG. 19 is a bottom view of an electrical device for rail mounting having two opposing latch members in an open position;

FIG. 20 is a sectional view along the line F-F of FIG. 19;

FIG. 21 is a detail of FIG. 20;

FIG. 28 is a perspective view of a latch member according to a second embodiment;

FIG. 29 is a bottom view of the latch member of FIG. 28;

FIG. 30 is a side view of the latch member of FIG. 28;

FIG. 31 is another side view of the latch member of FIG. 28.

DETAILED DESCRIPTION

Figure 1:
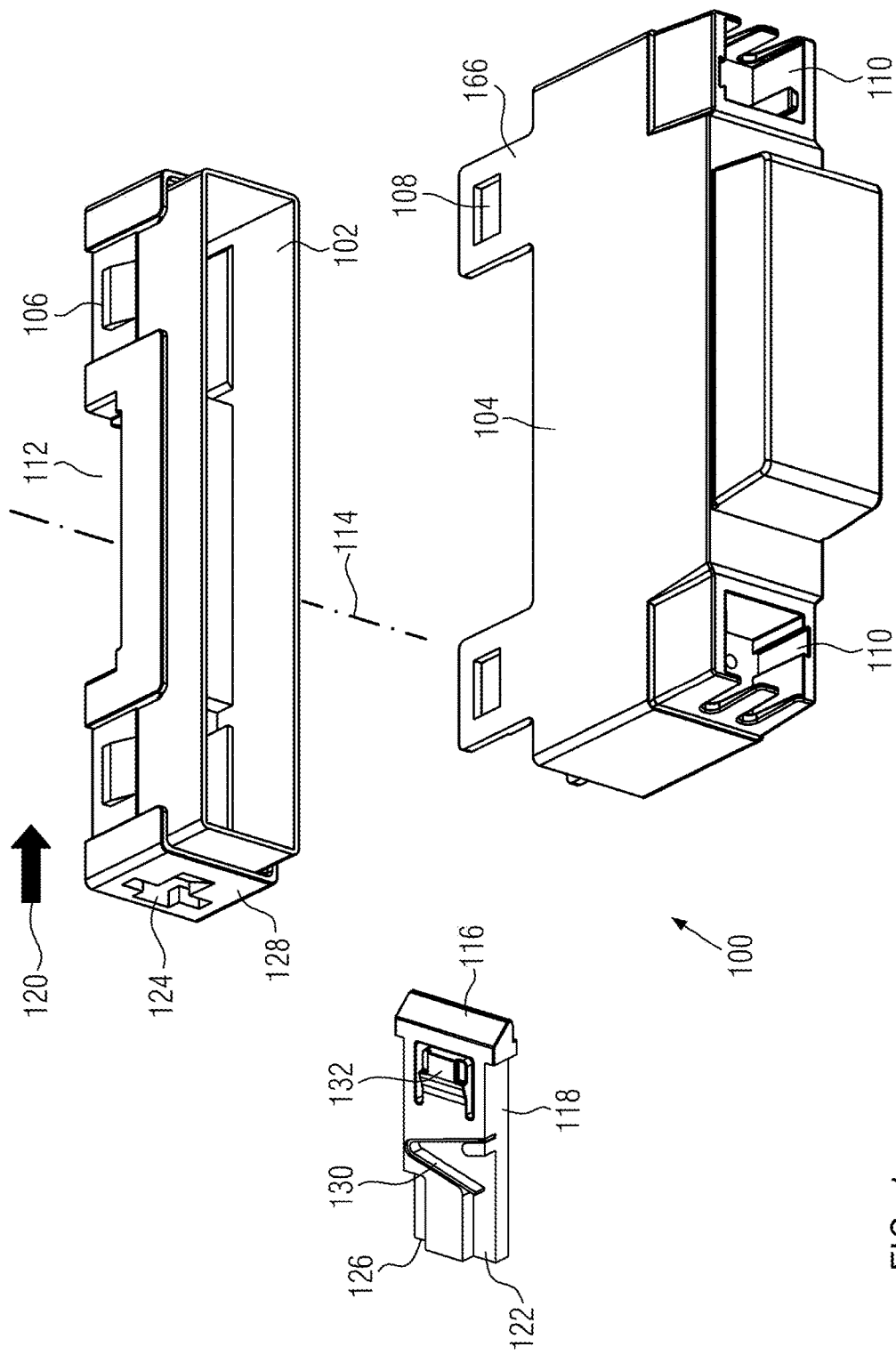
FIG. 1 is a schematic exploded perspective view of an electrical device for rail mounting.

The present invention will now be explained in more detail with reference to the Figures and firstly referring to FIG. 1. FIG. 1 shows a partly exploded perspective view of an electrical device 100 according to the present invention. According to the present invention, the electrical device 100 may be any kind of rail mounted electrical device, such as a circuit breaker, fuse unit, safety switching and/or control device, or a rail mounted power supply. Because the electric functionality is not important for the mechanical principle of the present invention, no further details on the electronic components are shown in the drawings. For instance, one or more connector receptacles 110 may be provided for connecting external electrical components to the electrical device 100.

According to an advantageous embodiment, an electrically insulating housing of the electrical device 10 comprises a bottom shell 102 and a cover 104. The cover 104 is fixed on the bottom shell 102 by means of four snap hooks 106 which engage with corresponding recesses 108 in order to form a closed protective housing. However, it is clear for a person skilled in the art that the housing may also be formed from a single part or from more than two parts. The bottom shell 102 and the cover 104 advantageously are fabricated from an electrically insulating plastic material.

The bottom shell 102 is formed to grip a rail (not shown in the Figures) within a rail recess 112. According to the shown embodiment of the present invention, the bottom shell 102 is adapted to be mounted on a so-called DIN rail (also known as top hat rail according to the European standard EN 50022, in the USA called TS35 rail). However, it is clear for a person skilled in the art that the mounting technique according to the present invention can of course also be employed with any other cross-sectional form of a mounting rail.

For gripping the rail, the rail recess 112 comprises two opposing rail gripping projections 116, at least one of which is movable in a direction across to a longitudinal axis 114 of the rail for mounting and dismounting the electrical device to/from the rail. As shown in FIG. 1, at least one of the rail gripping projections 116 is an integral part of a latch member 118. The latch member 118 is held slidably within the bottom shell 102. For pushing the latch member 118 in a direction indicated by the arrow 120 the latch member 118 has an actuating region 122 which passes through an actuating opening 124 provided at the bottom shell 102. In the fully locked state, the actuating region 122 is received within the actuating opening 124 and the outer surface 126 of the actuating region is flush with the outer surface 128 of the bottom shell 102. In the unlocked state, the actuating region 122 extends outside the actuating opening 124 and is accessible for an operator. In this position, a flat torsion spring 130 is compressed in order to resiliently bias the latch member 118 to automatically move in the direction 120 when released.

According to the present invention and as will become more apparent from FIGS. 16 to 21, the latch member 118 is secured in the locked as well as the unlocked position by means of a snap fit between the latch member 118 and the bottom shell 102. For this purpose, the latch member comprises a resilient catch arm 132.

Figure 2:
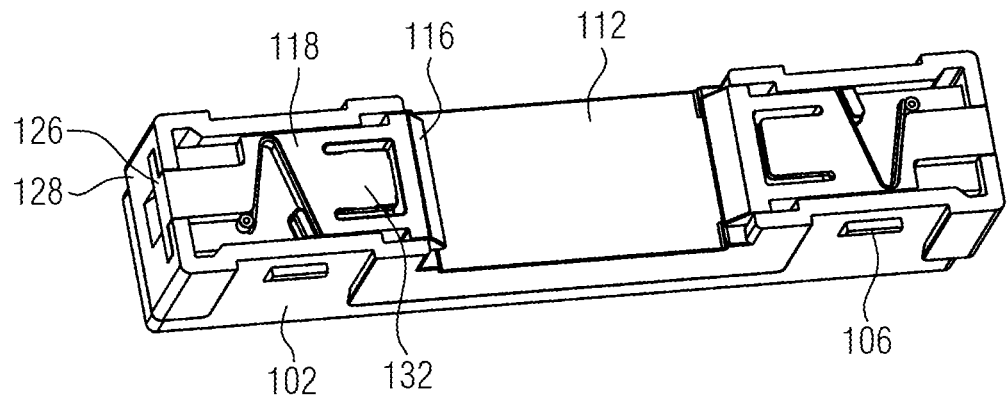
FIG. 2 is a schematic perspective sectional view of a bottom shell according to a first embodiment.

FIG. 2 shows a schematic sectional view of the bottom shell 102 with two latch members 118 each in a locked position, where the rail gripping projections 116 grip the DIN rail. In this position, the surface is 126 and 128 are flush, so that the latch member 118 is safely stored inside the housing. As can be seen more clearly from the enlarged detail shown in FIG. 3, the torsion spring 130 has a first leg 134 and a second leg 136 which are connected to each other via a hinge region 138. The first leg 134 rests 142 a retention pin 140 which is arranged at that part of the housing which is cut away in the view of FIGS. 2 and 3 and extends towards the latch member 118. The second leg 136 in held within a groove 142 provided at the latch member 118.

Figure 3:
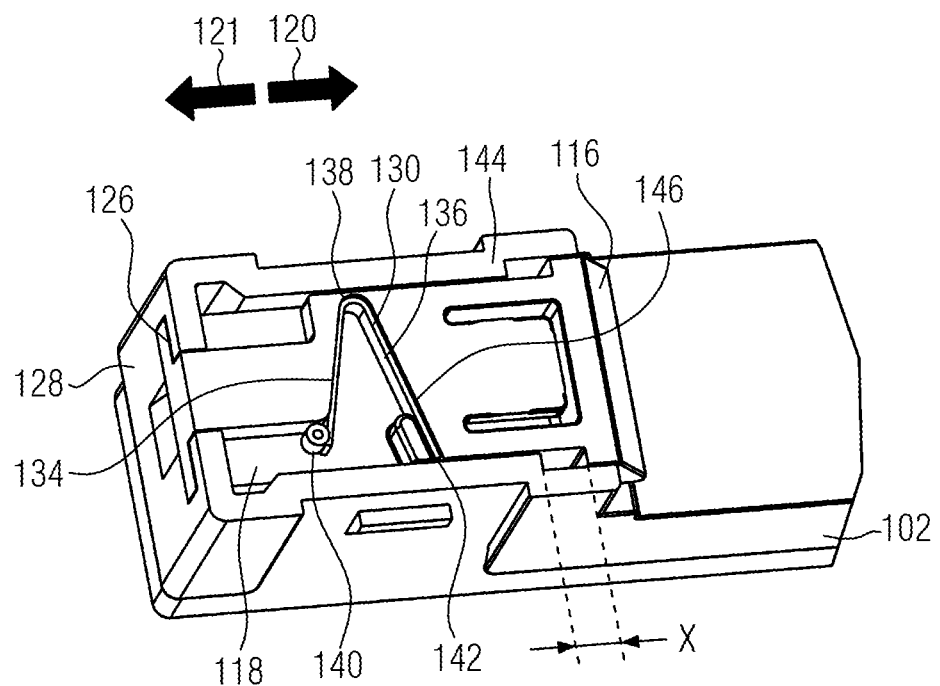
FIG. 3 is a detail of FIG. 2.

Consequently, when the latch member 118 is moved from the locked position shown in FIGS. 2 and 3 along direction 121 into the unlocked position, the retention pin 140 holds back the first leg 134 so that the torsion spring 130 is compressed to include a smaller angle between the first leg 134 and the second leg 136. Thereby energy is stored in the torsion spring 130 that will cause the latch member 118 to move back into the locked position when it is not actively restrained in the unlocked position.

Moreover, the bottom shell 102 further comprises stop angles 144 that limit the movement of the latch member 118 in the direction 121 to a distance X. Consequently, the retention pin 140 also deflects the first leg 134 of the torsion spring 130 by a maximum distance of X when the latch member 118 is slid from the locked into the unlocked position. When the spring 130 is deformed, the second leg 136 is fixed in the groove 142 and additionally rests against a support wall 146. Thereby it can be ensured that the torsion spring biases the latch member 118 with a uniformly distributed force (directed in the direction 120) across the latch member's complete breadth for allowing a smooth sliding movement back into the locked position.

FIG. 4 shows a top view of the bottom shell shown in FIG. 2. FIGS. 5 and 6 are sectional views along the lines A-A and B-B of FIG. 4, respectively. According to this particular embodiment, two latch members 118 can be inserted into latch member receptacles 148. In order to be able to use only one identical design of the latch member 118 for both sides, the latch member receptacles 148 are not formed symmetrical to each other, but are formed identical and turned by 180°.

FIGS. 7 and 8 show as enlarged details a first snap recess 150 and a second snap recess 152 formed at the housing for retaining the latch member 118 in the locked position and the unlocked position, respectively. The first and second snap recesses 150, 152 engage with a detent lug formed at the catch arm 132 of the latch member 118.

In order to be able to access the latch member 118 from the outside while it is in the final locked position, the bottom shell 102 comprises an opening 154. The opening 154 preferably only gives access for a suitable tool, for instance a screw driver or the like, so that unintentional releasing of the latch member 118 can be avoided.

Figure 10:
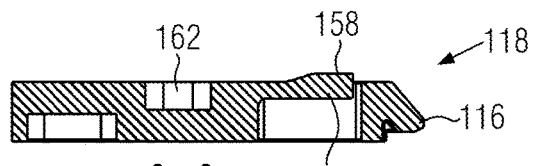
FIG. 10 is a sectional view along the line C-C of FIG. 9.
Figure 11:
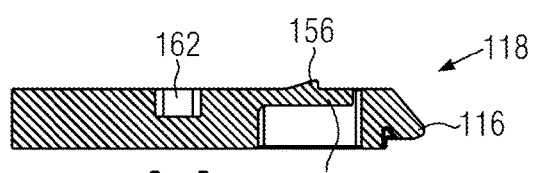
FIG. 11 is a sectional view along the line D-D of FIG. 9.
Figure 9:
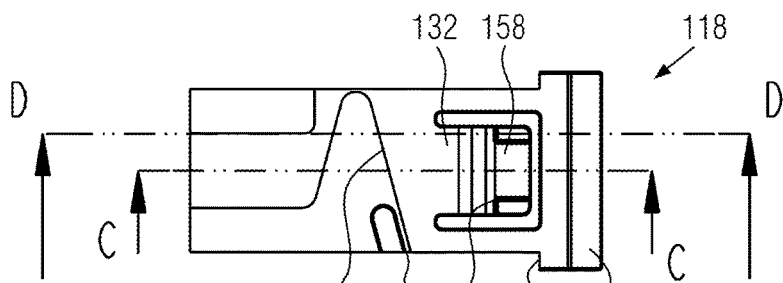
FIG. 9 is a top view of a latch member as shown in FIG. 1.

FIGS. 9 to 11 show different views of the latch member 118 which is fabricated as a part separate from the housing. According to the present invention, one end of the latch member 118 is formed as a rail gripping projection 116 which in the locked state of the latch member 118 grips behind the edge of a top hat rail as this is known to a person skilled in the art. The opposing end of the latch member 118 is formed as an actuating region 122 for pushing the latch member 118 from the outside into the housing (as will be explained in more detail below).

For securing the latch member 118 in the locked as well as in the unlocked state, the latch member 118 comprises a resilient catch arm 132. The catch arm 132 has a detent lug 156 that engages with either the first snap recess 150 or with the second snap recess 152 of the bottom shell 102 for fixing the latch member 118 in a fully inserted locking position or a partly extracted unlocked position, respectively. For actuating the catch arm through the opening 154, the catch arm has an essentially planar actuating section 158.

Stop edges 160 that are provided close to the rail gripping projection 116 interact with the stop angles 144 in order to prevent the latch member 118 to be pushed outside too far when being moved into the unlocked position.

According to the present invention, the latch member 118 is embedded in a depression 162 that essentially follows the outer contour of the torsion spring 130 in a relaxed or only slightly compressed state. Thereby a support wall 146 is formed that experiences an evenly distributed pressure force exerted by the second leg 136 of the torsion spring 130 when in a compressed state. Moreover, at the peripheral end of the support wall 146, a groove 142 is formed which firmly holds the end of the second leg 136. Thus, the torsion spring 130 can be assembled at the latch member 118 without getting lost.

Figure 12:
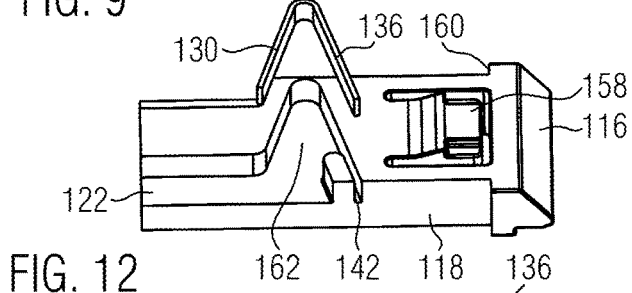
FIG. 12 is an exploded perspective view of the latch member with the torsion spring as shown in FIG. 1.
Figure 13:
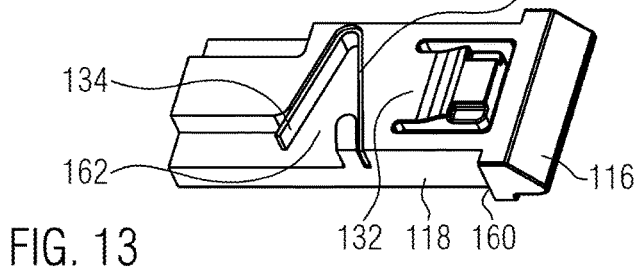
FIG. 13 is a perspective view of the latch member with the assembled torsion spring as shown in FIG. 1.

FIGS. 12 and 13 show the mounting are the slack torsion spring 130 inside the depression 162. As already mentioned, the flat torsion spring 130 may be slightly compressed in the state shown in FIG. 13, so that both legs are resting against the walls of the depression 162. The outer end of the second lead 136 is firmly held in the groove 142. In contrast thereto, the first leg 134 is movable towards the second leg 136. In particular, the peripheral end of the first leg 134 is accessible for engaging with the retention pin 140 that is provided at the bottom shell 102 of the housing.

Figure 14:
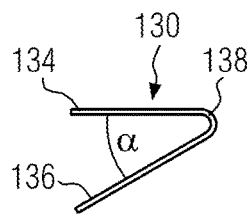
FIG. 14 is a top view of a flat torsion spring as shown in FIG. 1.
Figure 15:
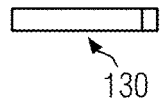
FIG. 15 is a side view of the flat torsion spring of FIG. 14.

The torsion spring 130 is depicted in FIGS. 14 and 15. According to the embodiment shown in the Figures, the torsion spring 130 is a flat spring that is formed from a cut and bent metal sheet. It is clear for a person skilled in the art, that of course also a wire spring, advantageously with some coil windings in the hinge region 138, can be provided.

FIG. 14 shows the flat torsion spring 130 in its tension free state. In this state, the angle α between the first and second legs 134, 136 is approximately 30°. Of course, also other angles α can be chosen according to the actual required displacement distances X.

The operation of the latch member 118 according to the present invention will now be explained in more detail with reference to FIGS. 16 to 21.

More specifically, FIGS. 16 to 18 refer to the latch members 118 being in a locked position ("Position 1"), where the electric device 100 is firmly attached to the rail. On the other hand, FIGS. 19 to 21 show the completely unlocked position ("Position 2"), where both latch members 118 are retracted from the rail so that the electrical device 100 and can be removed from the rail. Of course, it may also be sufficient to move only one of the latch members 118 into the unlocked position in order to be able to detach the electrical device 100 from the rail (this position is not shown in the Figures).

In the locked position, both latch members 118 are pushed towards the rail recess 112 so that a DIN rail can be firmly gripped by the rail gripping projections 116. The actuating regions 122 are completely within the bottom shell 102.

By inserting a suitable tool, such as a screwdriver, into the opening 154, the underlying catch arm 132 can be actuated and the latch member 118 can accordingly be moved into Position 2 (shown in FIGS. 19 to 21). In this position, the actuating region 122 is accessible from the outside. The detent lug 156 is held (with only a low force) in the second snap recess 152. In order to ensure that for mounting the electrical device 100 on the rail only a minor manual force is needed to lock the electrical device 100 safely on the rail, the latch member 118 is biased against the housing by means of the compressed torsion spring 130 when the latch member 118 is in the unlocked state.

Consequently, an operator can release the latch member 118 by pushing same inside. The spring force of the torsion spring 130 (which is compressed in Position 2) ensures that the latch member 118 slides back into the fully locked position. In the locked position the detent lug 156 snaps deeply into the first snap recess 150, so that the latch member 118 can only be released by actuating the resilient catch arm 132 upwardly through the opening 154.

With reference to the previous Figures, an embodiment has been explained in detail where the bottom shell 102 comprises two opposing latch members 118, so that two movable rail gripping projections 116 are extending into the rail recess 112.

Figure 22:
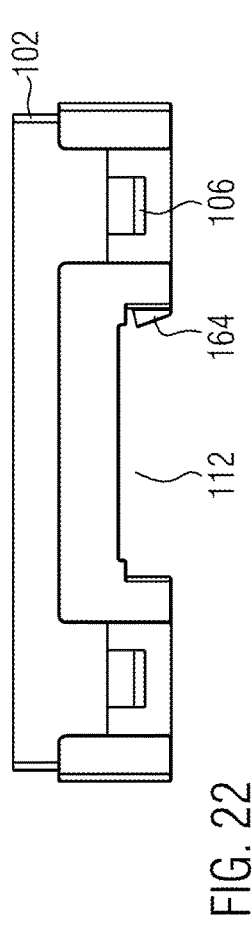
FIG. 22 is a side view of the bottom shell according to a second embodiment.
Figure 23:
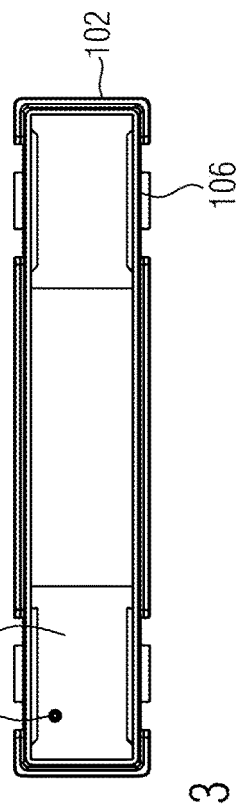
FIG. 23 is a top view of the bottom shell of FIG. 22.
Figure 24:
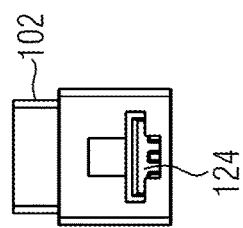
FIG. 24 is another side view of the bottom shell of FIG. 22.
Figure 27:
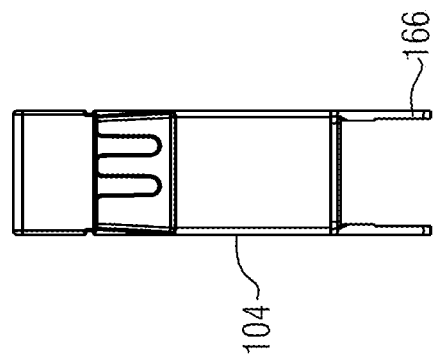
FIG. 27 is another side view of the cover shown in FIG. 25.

In contrast to such a solution having two slidable rail gripping projections 116, FIGS. 22 to 24 show a further embodiment of the present invention, where the bottom shell 102 comprises only one latch member receptacle 148 according to the principles of the present invention. For safely attaching the electrical device 100 to the DIN rail, the bottom shell 102 according to the present invention comprises a fixed rail gripping hook 164.

Figure 25:
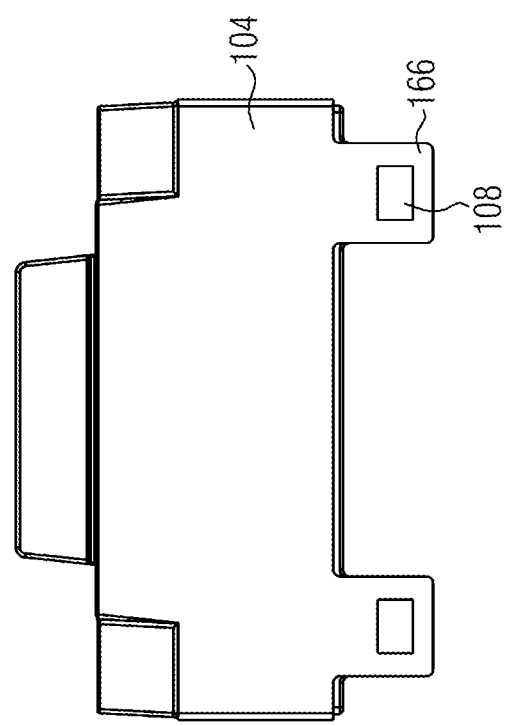
FIG. 25 is a side view of a cover as shown in FIG. 1.
Figure 26:
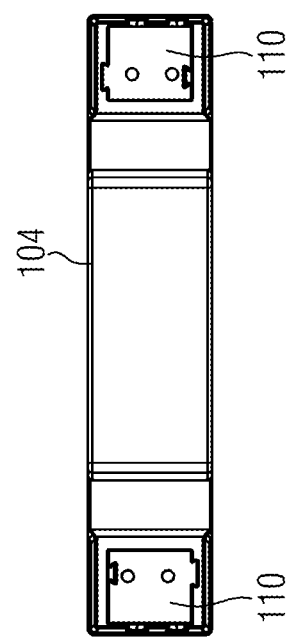
FIG. 26 is a top view of the cover shown in FIG. 25.

Independent from the particular embodiment of the bottom shell 102 of the housing, a cover 104 as shown in FIGS. 25 to 26 can be clicked on to the bottom shell 102 to form a closed electrically insulating housing. As already mentioned above, the electrically insulating housing may of course also be formed from one integral part or from more than two parts. According to the embodiment shown in the Figures, the cover is fixed by resilient flaps 166 having recesses 108 for the snap hooks 106. However, it is clear for a person skilled in the art that apart from a snap fixed connection also laser welding or gluing or any other suitable connection technique can be employed.

FIGS. 28 to 31 show an alternative embodiment of the latch member 118. According to this embodiment, the latch member 118 does not have a detent lug 156 which interacts with a first or second snap recess 150, 152 arranged on the lower surface of the bottom shell and which can be actuated through the opening 154 by means of a suitable tool. Instead, the resilient catch arm 132 has a catch hook arranged on the side oriented towards the cover 104. This catch hook interacts with an inner wall 170 (as indicated in FIG. 6) for ensuring that the latch member does not get lost prior to the assembly of the electrical device 100 on the DIN rail. According to this embodiment, the latch member 118 is not snap fixed in the open position, but needs to be held back by gripping a recess 172 for instance by means of a suitable tool.

| REFERENCE NUMERALS | |
|---|---|
| Reference Numeral | Description |
| 100 | Electrical device |
| 102 | Bottom shell |
| 104 | Cover |
| 106 | Snap hook |
| 108 | Recess for snap hook |
| 110 | Connector receptacle |
| 112 | Rail recess |
| 114 | Longitudinal axis of the rail |
| 116 | Rail gripping projection |
| 118 | Latch member |
| 120 | Direction into locked position (towards middle axis of the rail) |
| 121 | Direction into unlocked position (away from middle axis of the rail) |
| 122 | Actuating region at the latch member |
| 124 | Actuating opening at the housing |
| 126 | Outer surface of actuating region |
| 128 | Outer surface of bottom shell |
| 130 | Flat torsion spring |
| 132 | Catch arm |
| 134 | First leg |
| 136 | Second leg |
| 138 | Hinge region |
| 140 | Retention pin |
| 142 | Groove at the latch member |
| 144 | Stop angle |
| 146 | Support wall |
| 148 | Latch member receptacle |
| 150 | First snap recess at housing |
| 152 | Second snap recess at housing |
| 154 | Opening for actuating the catch arm |
| 156 | Detent lug |
| 158 | Actuating section |
| 160 | Stop edge |
| 162 | Depression |
| 164 | Fixed rail gripping hook |
| 166 | Resilient flap |
| 168 | Catch hook |
| 170 | Inner wall of bottom shell |
| 172 | Recess for holding open latch member |
| X | Distance of movement between locked and unlocked position |
| α | Angle between first and second leg |

The invention claimed is:

1. An electrical device for rail mounting, said electrical device comprising:

a housing having a rail receiving recess therein, at least one edge of said recess being defined by an end region of a latch member that is movable relative to the housing in a direction transverse to the recess, and resilient means biasing the latch member to move in a direction to reduce the width of said recess, wherein said resilient means comprise a torsion spring having a first leg and a second leg deflectable around a hinge region, said first leg resting against a protrusion of the housing, and said second leg resting against the latch member, and wherein the housing includes a retention pin that compresses the torsion spring in an open position of the latch member.

2. The electrical device according to claim 1, wherein said second leg of said torsion spring is at least partly received in a groove provided at the latch member.

3. The electrical device according to claim 1, wherein in an unloaded state an angle between the legs of the torsion spring is in a range between 20° and 40°.

4. The electrical device according to claim 1, wherein said torsion spring is a flat spring.

5. The electrical device according to claim 4, wherein said torsion spring is arranged in a recess of the latch member that follows the outer contour of the torsion spring in the unloaded state.

6. The electrical device according to claim 4, wherein the flat torsion spring has a V-shaped form.

7. The electrical device according to claim 1, wherein said first leg has a shorter length than said second leg extending from said hinge region.

8. The electrical device according to claim 1, wherein said latch member further comprises a detent lug that engages with a first detent recess at the housing for securing the latch member in a closed position.

9. The electrical device according to claim 8, wherein said detent lug is accessible from the outside of the housing for disengaging the detent lug from the housing.

10. The electrical device according to claim 9, wherein said housing comprises an opening for inserting a tool for disengaging the detent lug from the housing.

11. The electrical device according to claim 8, wherein said housing further comprises a second detent recess for securing the latch member in an open position.

12. The electrical device according to claim 1, wherein said housing comprises a bottom shell and a cover, and wherein said latch member is arranged at said bottom shell.

13. The electrical device according to claim 1, wherein the housing comprises an integrally formed fixed rail gripping hook which is arranged opposite to said latch member for gripping the rail.

14. The electrical device according to claim 1, wherein the housing comprises two opposing latch members for gripping the rail.

* * * * *